(12) United States Patent
Lee

(10) Patent No.: US 12,419,161 B2
(45) Date of Patent: Sep. 16, 2025

(54) DISPLAY APPARATUS AND METHOD OF MANUFACTURING THE SAME

(71) Applicant: Samsung Display Co., Ltd., Yongin-si (KR)

(72) Inventor: Seho Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 36 days.

(21) Appl. No.: 17/722,572

(22) Filed: Apr. 18, 2022

(65) Prior Publication Data

US 2022/0238607 A1 Jul. 28, 2022

Related U.S. Application Data

(62) Division of application No. 16/785,753, filed on Feb. 10, 2020, now Pat. No. 11,335,755.

(30) Foreign Application Priority Data

Mar. 20, 2019 (KR) .......................... 10-2019-0031777

(51) Int. Cl.
*H10K 59/124* (2023.01)
*H10K 59/121* (2023.01)
(Continued)

(52) U.S. Cl.
CPC ......... *H10K 59/124* (2023.02); *H10K 59/121* (2023.02); *H10K 59/131* (2023.02);
(Continued)

(58) Field of Classification Search
CPC ............ H01L 51/5228; H01L 27/3279; H10K 59/123; H10K 59/124; H10K 59/131; H10K 59/1315; H10K 59/80522
See application file for complete search history.

(56) References Cited

U.S. PATENT DOCUMENTS 7,701,132 B2   4/2010   Oh ...................... H01L 27/3276
                                                              313/504
8,022,618 B2   9/2011   Jo et al.
(Continued)

FOREIGN PATENT DOCUMENTS

CN          101383374 A       3/2009
EP            3333924 A1       6/2018
(Continued)

*Primary Examiner* — Tuan A Hoang
(74) *Attorney, Agent, or Firm* — CANTOR COLBURN LLP

(57) ABSTRACT

A display apparatus includes a pixel electrode and a opposite electrode facing each other; a thin-film transistor connected to the pixel electrode; a contact electrode connected to the opposite electrode and spaced apart from the pixel electrode; an auxiliary electrode connected to the contact electrode and spaced apart from the thin-film transistor; an intermediate layer with which light is emitted, the intermediate layer including: an emission layer, and a first functional layer corresponding to the pixel electrode and the contact electrode, the first functional layer defining an opening portion at which the contact electrode is exposed; and a multi-insulating layer between the thin-film transistor and the pixel electrode, between the auxiliary electrode and the contact electrode, and defining a contact opening at which the auxiliary electrode is connected to the contact electrode, the contact opening corresponding to the opening portion of the intermediate layer.

14 Claims, 8 Drawing Sheets

(51) Int. Cl.
  *H10K 59/131* (2023.01)
  *H10K 59/80* (2023.01)
  *H10K 50/15* (2023.01)
  *H10K 50/16* (2023.01)
  *H10K 50/17* (2023.01)
  *H10K 71/00* (2023.01)

(52) U.S. Cl.
  CPC ....... *H10K 59/80522* (2023.02); *H10K 50/15* (2023.02); *H10K 50/16* (2023.02); *H10K 50/171* (2023.02); *H10K 71/00* (2023.02)

(56) References Cited

U.S. PATENT DOCUMENTS

| | | | |
|---|---|---|---|
| 8,329,523 | B2 | 12/2012 | Choi et al. |
| 9,780,158 | B2 | 10/2017 | Lee et al. |
| 9,871,090 | B2 | 1/2018 | Lee et al. |
| 10,014,361 | B2 | 7/2018 | Choi et al. |
| 2009/0058280 | A1* | 3/2009 | Jo ...................... H10K 59/1315 313/504 |
| 2010/0244664 | A1 | 9/2010 | Fujioka et al. |
| 2012/0146030 | A1 | 6/2012 | You et al. |
| 2014/0354142 | A1 | 12/2014 | Jeong et al. |
| 2015/0137097 | A1 | 5/2015 | Choi et al. |
| 2015/0144922 | A1 | 5/2015 | Moon et al. |
| 2016/0126304 | A1* | 5/2016 | Cho ................. H10K 59/80522 438/23 |
| 2016/0126506 | A1 | 5/2016 | Lee et al. |
| 2016/0284785 | A1 | 9/2016 | Matsuura et al. |
| 2017/0148865 | A1 | 5/2017 | Cho et al. |
| 2018/0006098 | A1* | 1/2018 | Hong ............... H10K 59/80522 |
| 2018/0006106 | A1* | 1/2018 | Oh ...................... H10K 50/828 |
| 2018/0158878 | A1 | 6/2018 | Lee et al. |
| 2020/0135838 | A1 | 4/2020 | Han .................... H01L 27/3246 |

FOREIGN PATENT DOCUMENTS

| | | |
|---|---|---|
| KR | 20090020622 A | 2/2009 |
| KR | 101030968 B1 | 4/2011 |
| KR | 20140141529 A | 12/2014 |
| KR | 1020150011868 A | 2/2015 |
| KR | 20150058757 A | 5/2015 |
| KR | 1020160006520 A | 1/2016 |
| KR | 20160053357 A | 5/2016 |
| KR | 20160114496 A | 10/2016 |
| KR | 1020170044805 A | 4/2017 |
| KR | 20170060213 A | 6/2017 |
| KR | 1020170080136 A | 7/2017 |
| KR | 20180004878 A | 1/2018 |
| KR | 20180066320 A | 6/2018 |

\* cited by examiner

DISPLAY APPARATUS AND METHOD OF MANUFACTURING THE SAME

This application is a divisional application of U.S. application Ser. No. 16/785,753 filed Feb. 10, 2020, which claims priority to Korean Patent Application No. 10-2019-0031777, filed on Mar. 20, 2019, and all the benefits accruing therefrom under 35 U.S.C. § 119, the disclosure of which is incorporated herein in its entirety by reference.

BACKGROUND

1. Field

One or more embodiments relate to display apparatuses and methods of manufacturing the same. More particularly, one or more embodiments relate to a display apparatus which is relatively easily manufactured and having relatively high stability in brightness, and a method of manufacturing the display apparatus.

2. Description of the Related Art

Organic light-emitting display apparatuses have a relatively larger viewing angle, better contrast characteristics and a faster response speed than other display apparatuses, and thus, have drawn the attention as a next-generation display apparatus.

Organic light-emitting display apparatuses include pixels each including an organic light-emitting diode. An organic light-emitting diode includes a pixel electrode, an opposite electrode facing the pixel electrode, and an intermediate layer including an emission layer between the pixel electrode and the opposite electrode. In these organic light-emitting display apparatuses, pixel electrodes have island shapes obtained by patterning a material layer to respectively correspond to individual units of pixels, but an opposite electrode has a single body corresponding to a plurality of pixels.

SUMMARY

With an increase in a planar area of an organic light-emitting display apparatus, a conventional organic light-emitting display apparatus is unable to display a high-quality image due to a voltage drop of an opposite electrode provided as a single body.

In order to address several drawbacks including the aforementioned drawback, one or more embodiments include a display apparatus that is relatively easily manufactured and has high stability in brightness, and a method of manufacturing the display apparatus. However, the one or more embodiments are only examples, and the scope of the invention is not limited thereto.

Additional features will be set forth in part in the description which follows and, in part, will be apparent from the description, or may be learned by practice of the presented embodiments.

According to one or more embodiments, a display apparatus includes a pixel electrode and a opposite electrode facing each other, on a substrate; a pixel circuit including a thin-film transistor, the pixel circuit electrically connected to the pixel electrode at the thin-film transistor; a contact electrode connected to the opposite electrode and through which an electrical signal is transmitted to the opposite electrode, the contact electrode and the pixel electrode spaced apart from each other along the substrate; an auxiliary electrode connected to the contact electrode and through which the electrical signal is transmitted to the contact electrode, the auxiliary electrode and the thin-film transistor spaced apart from each other along the substrate; an intermediate layer with which light is emitted, the intermediate layer including: an emission layer corresponding to the pixel electrode, and a first functional layer corresponding to the pixel electrode and the contact electrode, the first functional layer defining an opening portion at which the contact electrode is exposed to outside the intermediate layer; and a multi-insulating layer between the thin-film transistor and the pixel electrode and between the auxiliary electrode and the contact electrode, the multi-insulating layer defining a contact opening at which the auxiliary electrode is connected to the contact electrode, the contact opening corresponding to the opening portion of the intermediate layer.

According to one or more embodiments, the opening portion may include a first opening and a second opening spaced apart from each other; and the opposite electrode may be connected to the contact electrode at the first opening and at the second opening.

According to one or more embodiments, the multi-insulating layer may include: an inorganic insulating layer and an organic insulating layer which is further from the substrate than the inorganic insulating layer, and in an area corresponding to the first opening, the organic insulating layer may define an open portion at which the opposite electrode is connected to the contact electrode.

According to one or more embodiments, in the area corresponding to the first opening, the inorganic insulating layer may be between the contact electrode and the auxiliary electrode to insulate the contact electrode from the auxiliary electrode.

According to one or more embodiments, in an area corresponding to the second opening, the organic insulating layer may include a first contact hole at which the opposite electrode is connected to the contact electrode, and the inorganic insulating layer may define a second contact hole corresponding to the first contact hole and at which the contact electrode is connected to the auxiliary electrode.

According to one or more embodiments, the intermediate layer may further include a second functional layer facing the first functional layer with the emission layer therebetween, a first hole may be defined in the first functional layer, and a second hole may be defined in the second functional layer, and the first opening of the intermediate layer may be defined by the first hole and the second hole aligned with each other.

According to one or more embodiments, a third hole may be defined in the first functional layer, a fourth hole may be defined in the second functional layer, and the second opening may be defined by the third hole and the fourth hole aligned with each other.

According to one or more embodiments, the intermediate layer may include one or more of a hole transport layer, a hole injection layer, an electron injection layer, and an electron transport layer.

According to one or more embodiments, the auxiliary electrode may include copper (Cu) and titanium (Ti).

According to one or more embodiments, a portion of the first functional layer which is defined at the first opening of the intermediate layer may be a denatured portion of the first functional layer.

According to one or more embodiments, the thin-film transistor of the pixel circuit may include a semiconductor layer, a gate electrode corresponding to the semiconductor layer, and a connection electrode electrically connected to the semiconductor layer, and the auxiliary electrode and the connection electrode may be respective portions of a same material layer on the substrate.

According to one or more embodiments, the inorganic insulating layer may directly contact the connection electrode of the thin-film transistor to cover the thin-film transistor.

According to one or more embodiments, the contact electrode and the pixel electrode may be respective portions of a same material layer on the substrate.

According to one or more embodiments, the multi-insulating layer may include an inorganic insulating layer and an organic insulating layer which is further from the substrate than the inorganic insulating layer; and in an area corresponding to the opening portion of the first functional layer, the organic insulating layer may define an open portion at which the opposite electrode is electrically connected to the contact electrode.

According to one or more embodiments, in the area corresponding to the opening portion of the first functional layer, the inorganic insulating layer may define a contact opening corresponding to the open portion of the organic insulating layer and at which the contact electrode is further electrically connected to the auxiliary electrode.

According to one or more embodiments, the inorganic insulating layer may be between the contact electrode and the auxiliary electrode except for the contact opening.

According to one or more embodiments, a method of manufacturing a display apparatus includes providing on a substrate: a pixel electrode and a opposite electrode facing each other, a thin-film transistor electrically connected to the pixel electrode, a contact electrode connected to the opposite electrode and through which an electrical signal is transmitted to the opposite electrode, the contact electrode spaced apart from the pixel electrode, an auxiliary electrode connected to the contact electrode and through which the electrical signal is transmitted to the contact electrode, the auxiliary electrode spaced apart from the thin-film transistor, an inorganic insulating layer corresponding to the thin-film transistor and the auxiliary electrode, an organic insulating layer between the inorganic insulating layer and the pixel electrode and between the inorganic insulating layer and the contact electrode, an open portion in the organic insulating layer which exposes the inorganic insulating layer to outside the organic insulating layer, and a contact opening in the organic insulating layer and the inorganic insulating layer which exposes the auxiliary electrode to outside the organic insulating layer and the inorganic insulating layer; providing an intermediate layer with which light is emitted, by sequentially providing: a first functional layer corresponding to the pixel electrode and the contact electrode, and an emission layer corresponding to the pixel electrode; removing a portion of the first functional layer which corresponds to the contact electrode, to provide an opening in the first functional layer which exposes the contact electrode to outside the first functional layer; and contacting the opposite electrode to the contact electrode at the opening in the first functional layer.

According to one or more embodiments, the providing of the opening includes removing a portion of the first functional layer, by radiating a laser beam to the first functional layer.

According to one or more embodiments, the providing the intermediate layer may include providing a second functional layer after providing the emission layer, the second functional layer corresponding to the pixel electrode and the contact electrode, and the method may further include removing a portion of the second functional layer which corresponds to the contact electrode, simultaneously with the removing the portion of the first functional layer which corresponds to the contact electrode, to provide the opening in both the first functional layer and the second functional layer.

According to one or more embodiments, the open portion may be larger than the contact portion.

These and/or other features will become apparent and more readily appreciated from the following description of the embodiments, the claims, and the accompanying drawings.

These general and specific embodiments may be implemented by using a system, a method, a computer program, or a combination thereof.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
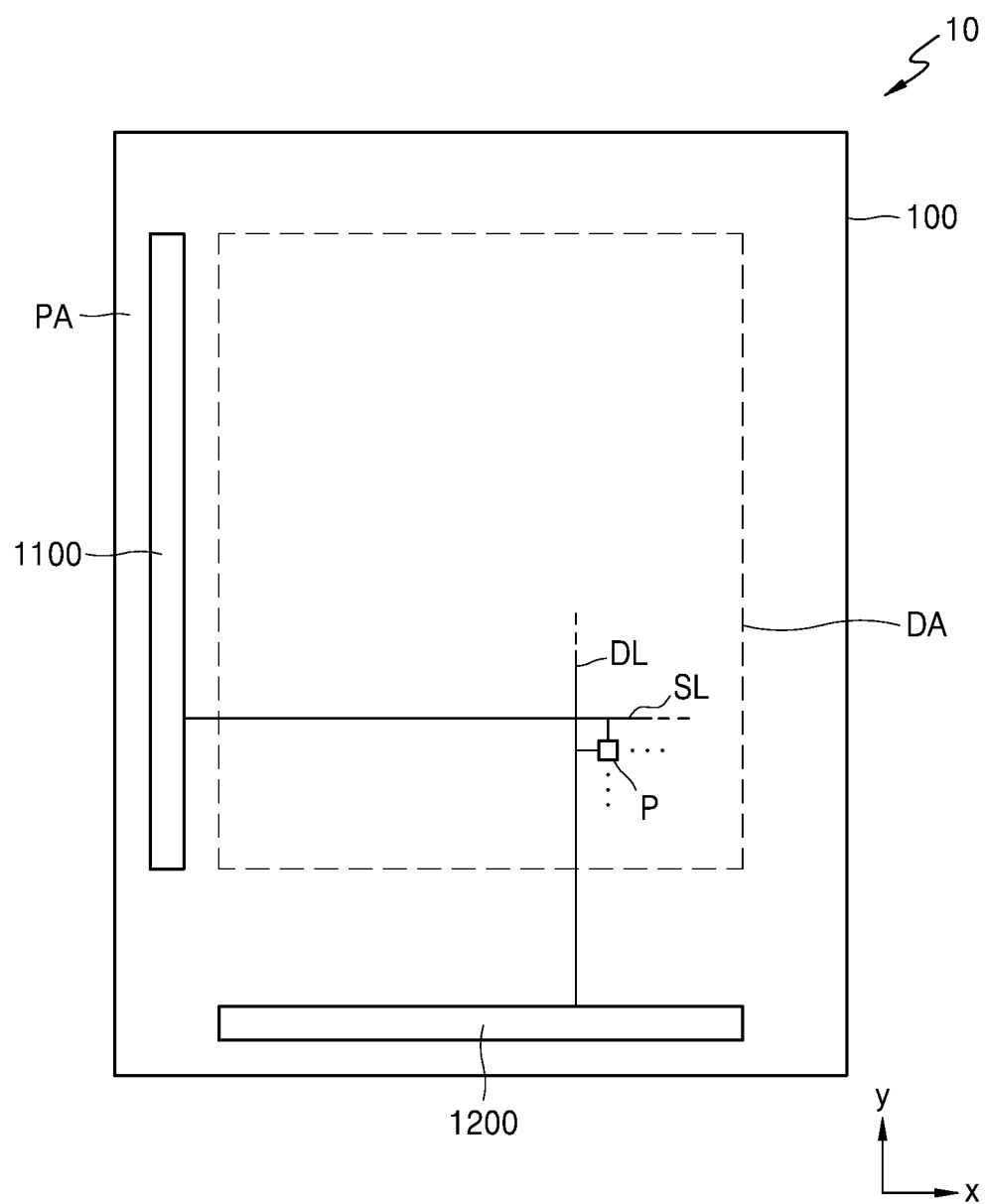
FIG. 1 is a schematic top plan view of an embodiment of a display apparatus.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Expressions such as "at least one of," when preceding a list of elements, modify the entire list of elements and do not modify the individual elements of the list. "At least one" is not to be construed as limiting "a" or "an." "or" means "and/or." As used herein, the singular forms "a", "an" and "the" are intended to include the plural forms as well, unless the context clearly indicates otherwise.

It will be understood that although the terms "first," "second," etc. may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components.

It will be understood that when a layer, region, or component is referred to as being related to another layer such as being "on" another layer, region, or component, it can be directly or indirectly formed on the other layer, region, or component. That is, for example, intervening layers, regions, or components may be present. In contrast, when a layer, region, or component is referred to as being related to another layer such as being "directly on" another layer, region, or component, no intervening layers, regions, or components are present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of elements in the drawings may be exaggerated for convenience of explanation. In other words, since sizes and thicknesses of components in the drawings are arbitrarily illustrated for convenience of explanation, the following embodiments are not limited thereto. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
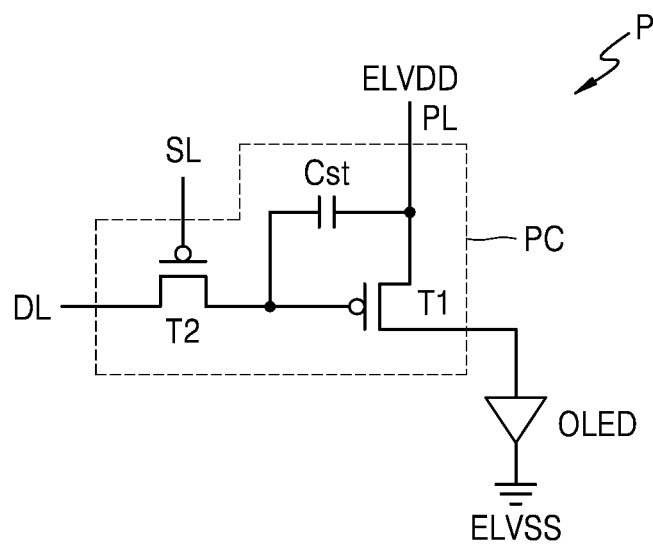
FIG. 2 is an equivalent circuit diagram of an embodiment of one pixel of a display apparatus.

FIG. 1 is a schematic top plan view of an embodiment of a display apparatus, and FIG. 2 is an equivalent circuit diagram of an embodiment of a pixel of a display apparatus.

Referring to FIG. 1, a display apparatus 10 may include a display area DA and a peripheral area PA which is adjacent to the display area DA. In an embodiment, the peripheral area PA may surround the display area DA in the top plan view. As indicating an overall top plan view of the display apparatus 10, FIG. 1 indicates a substrate 100 of the display apparatus 10. An image is displayed and/or light is emitted at the display area DA. In the peripheral area PA, an image may not be displayed and/or light may not be emitted, to define a non-display area PA.

The display apparatus 10 and/or various components thereof may include the display area DA and the peripheral area PA. Referring to FIG. 1, for example, the substrate 100 may include the display area DA and the peripheral area PA. The display apparatus 10 and/or various components thereof may be disposed in a plane defined by a first direction and a second direction which cross each other. Referring to FIG. 1, the substrate 100 is disposed in a plane defined by an x-axis direction and a y-axis direction. A thickness of the display apparatus 10 and/or various components thereof is defined along a third direction which crosses each of the first direction and the second direction. Referring to FIG. 2, a thickness of the substrate 100 and various layers thereon is defined along a z-axis direction.

The display apparatus 10 includes a pixel P provided in plural (e.g., a plurality of pixels P or pixels P) arranged in the display area DA. Referring to FIG. 2, each of the pixels P may include a pixel circuit PC and an organic light-emitting diode OLED as a display element (e.g., a light emitting element) which is connected to the pixel circuit PC. The pixel circuit PC may include a first thin-film transistor ("TFT") T1, a second TFT T2, and a storage capacitor Cst. Each of the pixels P may emit, for example, red light, green light, blue light or white light, via the organic light-emitting diode OLED. An image may be displayed at the pixels P with the light emitted from the organic light-emitting diode OLED.

The second TFT T2 (e.g., a switching TFT T2) may be connected to a scan line SL and a data line DL, and transmit, to the first TFT T1, a data voltage received via the data line DL, based on a switching voltage received via the scan line SL. The storage capacitor Cst may be connected to the second TFT T2 and a driving voltage line PL and may store a voltage corresponding to a difference between a voltage received from the second TFT T2 and a first power supply voltage ELVDD supplied to the driving voltage line PL. That is, the various lines described herein may represent signal lines through which an electrical signal (e.g., data, control, driving and/or power signals) is transmitted. In an embodiment, the electronic signals may include the data voltage, the switching voltage, the power supply voltage, a scan signal, a data signal, etc.

The first TFT T1 (e.g., a driving TFT T1), may be connected to the driving voltage line PL and the storage capacitor Cst and may control an electrical driving current flowing from the driving voltage line PL to the organic light-emitting diode OLED, in accordance with a voltage value stored in the storage capacitor Cst. The organic light-emitting diode OLED may generate and/or emit light having a certain brightness by the electrical driving current. An opposite electrode (for example, a cathode) of the organic light-emitting diode OLED may receive a second power supply voltage ELVSS.

Although a case where the pixel circuit PC includes two TFTs and one storage capacitor Cst is illustrated in FIG. 2, embodiments are not limited thereto. A number of TFTs and a number of the storage capacitor Cst may vary according to a design of the pixel circuit PC. In an embodiment, For example, the pixel circuit PC may further include 4, 5 or more TFTs in addition to the aforementioned two TFTs.

Referring back to FIG. 1, a scan driver 1100 which generates and/or provides a scan signal to each of the pixels P, a data driver 1200 which generates provides a data signal to each of the pixels P, and a main power wire (not shown) through which is provided first and second power supply voltages, may be arranged in the peripheral area PA. In FIG. 2, the data driver 1200 is located at one side of the substrate 100. However, according to another embodiment, the data driver 1200 may be located external to the substrate 100, such as being on a flexible printed circuit board ("FPCB") which is electrically connected to a pad of the display apparatus 10. In an embodiment, the pad may be disposed on the substrate 100, and the FPCB may be connected to the display apparatus 10 at the pad.

FIGS. 3 through 6 are cross-sectional views illustrating processes and structure in an embodiment of a method of manufacturing a display apparatus. It will be understood that the various layers which are provided on the substrate 100 in the following description, may be present on the substrate 100 of FIG. 1, but are omitted in FIG. 1 for convenience of illustration. In an embodiment, the left side of the views in FIGS. 3 through 6 may correspond to a peripheral area PA (FIG. 1) while the right side of the views in FIGS. 3 through 6 may correspond to a display area DA (FIG. 1), without being limited thereto.

Figure 3:
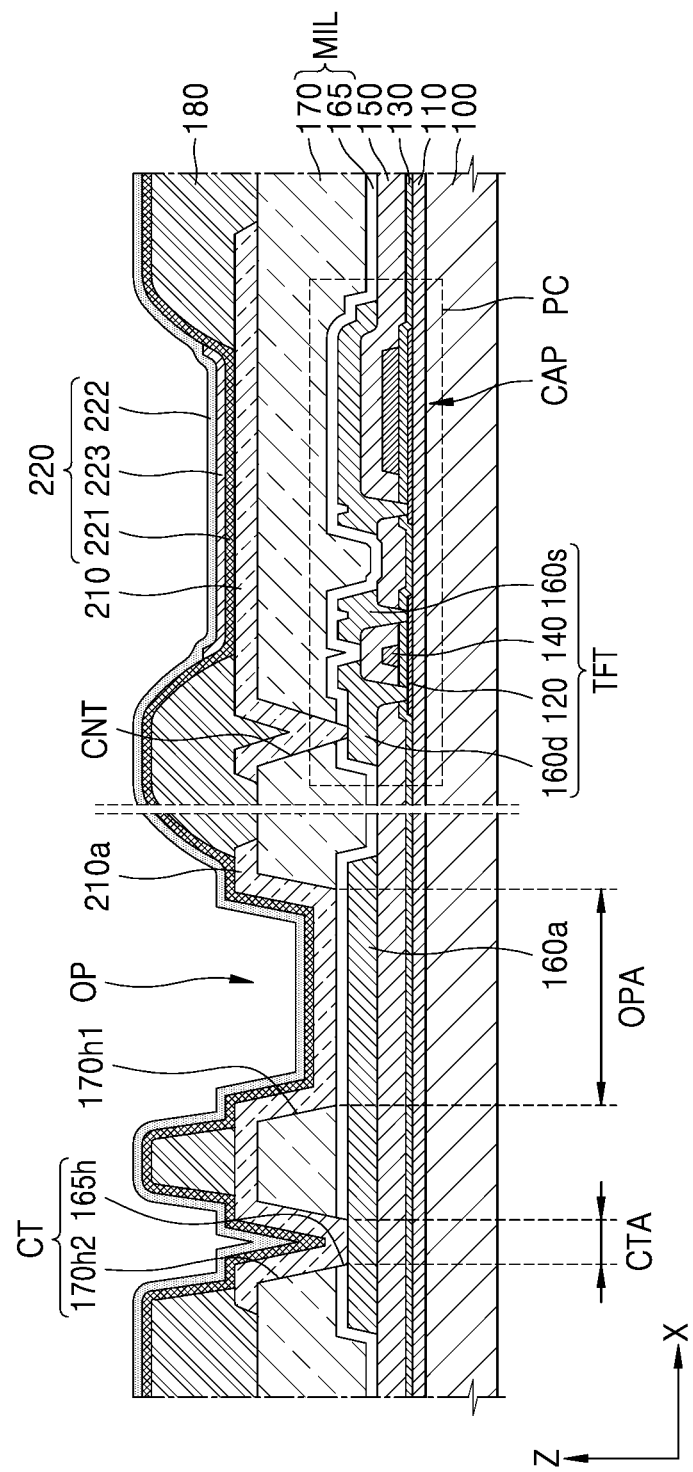
FIGS. 3 through 6 are cross-sectional views illustrating processes and structure in an embodiment of a method of manufacturing a display apparatus.

Referring to FIG. 3, a pixel electrode 210 and a contact electrode 210a that are spaced apart from each other may be provided or formed on the substrate 100. Although the pixel electrode 210 and the contact electrode 210a are provided or formed on an organic insulating layer 170 in FIG. 3, embodiments are not limited thereto.

Various layers may be provided or formed between the substrate 100 and each of the pixel electrode 210 and the contact electrode 210a, respectively. Referring to FIGS. 3 through 6, a thin-film transistor TFT and a capacitor CAP are provided or formed on the substrate 100, a multi-insulating layer MIL (e.g., an insulating multi-layer MIL) is provided or formed to cover the thin-film transistor TFT and the capacitor CAP. The pixel electrode 210 and the contact electrode 210a are provided or formed on the multi-insulating layer MIL.

The substrate 100 may include any of various materials, for example, glass, metal, or plastic such as polyethylene terephthalate ("PET"), polyethylene naphthalate ("PEN"), or polyimide ("PI").

A pixel circuit PC for providing an electrical signal to a display element, for example, the organic light-emitting diode OLED, is provided or formed on the substrate 100. The pixel circuit PC may include the thin-film transistor TFT and the capacitor CAP. In an embodiment, the electrical signal may be provided from outside the display area DA, to the display element in the display area DA.

In detail, to planarize a surface of the substrate 100 and/or prevent impurities or the like from permeating a semiconductor layer 120 of the thin-film transistor TFT, a buffer layer 110 may be arranged on the substrate 100. The buffer layer 110 may include silicon oxide (SiOx), silicon nitride (SiNx), or/and silicon oxynitride (SiON), and the semiconductor layer 120 may be located on the buffer layer 110.

A gate electrode 140 of the thin-film transistor TFT is arranged on the semiconductor layer 120. A source electrode 160s and a drain electrode 160d of the thin-film transistor TFT electrically communicate with each other in response to a signal applied to the gate electrode 140. In an embodiment, for example, the gate electrode 140 may include or be formed of at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single- or multi-layered structure, considering adhesion to an adjacent layer, surface smoothness of a layer stacked on the gate electrode 140, and processability.

To secure insulation between the semiconductor layer 120 and the gate electrode 140 within the thin-film transistor TFT, a gate insulating layer 130 may be between the semiconductor layer 120 and the gate electrode 140. Referring to FIG. 3, the gate insulating layer 130 may be further within the capacitor CAP. That is, the gate insulating layer 130 described above may be respective portions of a same gate insulating material layer. The gate insulating layer 130 may include an inorganic insulating material, such as silicon oxide, silicon nitride, silicon oxynitride, aluminum oxide, titanium oxide, tantalum oxide, or hafnium oxide.

An interlayer insulating layer 150 may be arranged on the gate electrode 140 and may include an inorganic insulating material, such as silicon oxide, silicon nitride, silicon oxynitride, aluminum oxide, titanium oxide, tantalum oxide, or hafnium oxide. The interlayer insulating layer 150 may be provided or formed as a single layer structure or multi-layer structure including one or more of the aforementioned materials.

The source electrode 160s and the drain electrode 160d, which are each a connection electrode electrically connected to the semiconductor layer 120 of the thin-film transistor TFT, are arranged on the interlayer insulating layer 150. The source electrode 160s and the drain electrode 160d are electrically connected to the semiconductor layer 120 via contact holes provided or formed in the interlayer insulating layer 150 and the gate insulating layer 130. The source electrode 160s and the drain electrode 160d may each include or be formed of at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single-layered or multi-layered structure, considering conductivity or the like. According to an embodiment, each of the source electrode 160s and the drain electrode 160d, which are the connection electrode, may be provided or formed as a triple layer of Ti/Al/Ti or Mo/Al/Mo. According to an embodiment, each of the source electrode 160s and the drain electrode 160d may be provided or formed as a multi-layer structure of Cu/Ti.

To protect the thin-film transistor TFT having the aforementioned layers and planarize an upper surface of the thin-film transistor TFT, the multi-insulating layer MIL may be provide or formed on the thin-film transistor TFT. According to the present embodiment, the multi-insulating layer MIL may include an inorganic insulating layer 165 directly in contact with the source electrode 160s and the drain electrode 160d of the thin-film transistor TFT, and an organic insulating layer 170 which provides a planar an upper surface on which the pixel electrode 210 is provided or formed.

The inorganic insulating layer 165 may prevent exposure to an etching material and/or etching environment (e.g., an etchant), of a conductive wire or conductive element (e.g., like a signal line) including metal that may be damaged by an etchant, like aluminum, during the manufacture of the display apparatus. The inorganic insulating layer 165 may include an inorganic material, such as silicon oxide (SiOx), silicon nitride (SiNx), or/and silicon oxynitride (SiON), and may be provided or formed as a multi-layer structure or a single layer structure. According to an embodiment, the inorganic insulating layer 165 may include silicon nitride (SiNx).

The inorganic insulating layer 165 may have a thickness of at least about 500 angstroms (Å). According to another embodiment, the thickness of the inorganic insulating layer 165 may be equal to or greater than about 1,000 Å, may be equal to or greater than about 1,500 Å, may be equal to or greater than about 2,000 Å, may be equal to or greater than about 2,500 Å, may be equal to or greater than about 3,000 Å, may be equal to or greater than about 3,500 Å, may be equal to or greater than about 4,000 Å, may be equal to or greater than about 4,500 Å, may be equal to or greater than about 5,000 Å, may be equal to or greater than about 5,500 Å, may be equal to or greater than about 6,000 Å, or may be equal to or greater than about 6,500 Å. Alternatively, the inorganic insulating layer 165 may have a thickness of about 7,000 Å to about 10,000 Å.

The organic insulating layer 170 may be arranged on the inorganic insulating layer 165, to be disposed further from the substrate 100 than the inorganic insulating layer 165. An upper surface of the organic insulating layer 170 may be approximately flat. The organic insulating layer 170 may include an organic insulating material, polymethyl methacrylate ("PMMA") or polystyrene ("PS"), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a blend thereof. According to an embodiment, the organic insulating layer 170 may include polyimide.

The pixel electrode 210 may be on the organic insulating layer 170. The pixel electrode 210 may include conductive oxide, such as indium tin oxide ("ITO"), indium zinc oxide ("IZO"), zinc oxide ("ZnO"), indium oxide ($In_2O_3$), indium gallium oxide ("IGO"), or aluminum zinc oxide ("AZO"). According to another embodiment, the pixel electrode 210 may reflect light such as by including a reflection layer or reflecting material. The pixel electrode 210 may include, for example, silver (Ag), magnesium (Mg), aluminum (Al), platinum (Pt), palladium (Pd), gold (Au), nickel (Ni), neodymium (Nd), iridium (Ir), chromium (Cr), or a combination of these materials. According to another embodiment, the pixel electrode 210 may further include a relatively thin layer or film provided or formed of ITO, IZO, ZnO, or $In_2O_3$. Such thin layer or film may be disposed above or below the reflection layer.

A pixel defining layer 180 may be arranged on the pixel electrode 210. The pixel defining layer 180 may define or include an opening via which an upper surface of the pixel electrode 210 is exposed and may cover an edge of the pixel electrode 210. The opening in the pixel defining layer 180 may correspond to or define a light emitting area of a pixel P. The pixel defining layer 180 may include an organic insulating material. Alternatively, the pixel defining layer 180 may include an inorganic insulating material, such as silicon nitride (SiNx), silicon oxynitride (SiON), or silicon oxide (SiOx). Alternatively, the pixel defining layer 180 may include both an organic insulating material and an inorganic insulating material.

An intermediate layer 220 includes an emission layer 223. The intermediate layer 220 may include a first functional layer 221 below the emission layer 223, and/or a second functional layer 222 above the emission layer 223. The emission layer 223 may include a relatively low-molecular-weight or relatively high-molecular-weight organic material with which light of a certain color is generated and/or emitted.

Referring to FIG. 3, a preliminary first functional material layer 221 and a preliminary second functional material layer 222 are initially provided or formed on the substrate 100, for example, along an entirety of the substrate 100. In an embodiment, the preliminary first functional material layer 221 and the preliminary second functional material layer 222 are provided corresponding to the display area DA (FIG. 1) and the peripheral area PA (FIG. 1). The following description of the method refers to the first functional layer 221 and the second functional layer 222 for convenience of explanation, however, it will be understood that intermediate processes for forming these layers include the preliminary forms of the material layers for forming the first functional layer 221 and the second functional layer 222.

The first functional layer 221 (e.g., the preliminary first functional material layer 221) may include a single layer structure or a multi-layer structure. In an embodiment, for example, when the first functional layer 221 is provided or formed of a relatively high-molecular-weight organic material, the first functional layer 221 may include a hole transport layer ("HTL") having a single-layer structure and may include poly-(3,4)-ethylene-dihydroxy thiophene ("PEDOT") or polyaniline ("PANI"). On the other hand, when the first functional layer 221 is provided or formed of a relatively low-molecular-weight organic material, the first functional layer 221 may include a hole injection layer ("HIL") and an HTL.

The second functional layer 222 may be omitted. In an embodiment, for example, when the first functional layer 221 and the emission layer 223 are provided or formed of relatively high molecular weight materials, the second functional layer 222 may be included in the stacked structure on the substrate 100 as described above. The second functional layer 222 (e.g., the preliminary second functional material layer 222) may include a single layer structure or a multi-layer structure. The second functional layer 222 may include an electron transport layer ("ETL"), and/or an electron injection layer ("EIL").

The emission layer 223 of the intermediate layer 220 may be arranged in each pixel P within the display area DA. The emission layer 223 may be patterned as a discrete element to correspond to the pixel electrode 210. In contrast with the emission layer 223, the first functional layer 221 and/or the second functional layer 222 of the intermediate layer 220 may be provided or formed to corresponding to multiple pixels P. In an embodiment, the first functional layer 221 and/or the second functional layer 222 of the intermediate layer 220 may correspond to an entirety of the display area DA, similar to a structure of an opposite electrode 230 which will be described later. In an embodiment, the first functional layer 221 and/or the second functional layer 222 of the intermediate layer 220 may further correspond to the peripheral area PA.

The opposite electrode 230 may include a conductive material having a relatively low work function. In an embodiment, for example, the opposite electrode 230 may include a (semi)transparent material layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 230 may further include a material layer, such as ITO, IZO, ZnO, or $In_2O_3$, on the (semi)transparent material layer including any of the above-described materials. In an embodiment of manufacturing a display apparatus 10, the first functional layer 221, the second functional layer 222, and the opposite electrode 230 may be provided or formed by thermal deposition of a material for forming the respective layer or electrode.

An auxiliary electrode 160a may be arranged on the interlayer insulating layer 150, on one side of the pixel circuit PC. In an embodiment, the auxiliary electrode 160a may be disposed in the peripheral area PA (FIG. 1) without being limited thereto. The auxiliary electrode 160a may be provided or formed using the same process as that used to form the source electrode 160s and the drain electrode 160d. An electrode of the capacitor CAP may be provided or formed using the same process as that used to form the source electrode 160s and the drain electrode 160d. Accordingly, the auxiliary electrode 160a and/or the electrode of the capacitor CAP may include the same material as that included in the source electrode 160s and the drain electrode 160d. Referring to the similar hatching pattern in FIG. 3, the auxiliary electrode 160a, the electrode of the capacitor CAP, the source electrode 160s and the drain electrode 160d may be respective portions of a same material layer on the substrate 100, and may be portions respectively formed from a same material layer in a method of manufacturing the display apparatus 10. According to an embodiment, the auxiliary electrode 160a may be provided or formed as a multi-layer structure of Cu/Ti.

The multi-insulating layer MIL may be arranged on the auxiliary electrode 160a. The inorganic insulating layer 165 may directly contact the auxiliary electrode 160a to prevent exposure of the auxiliary electrode 160a to an etching environment according to a subsequent process and may reduce or effectively prevent detachment of the auxiliary electrode 160a from other layers on the substrate 100.

The multi-insulating layer MIL may have a contact portion CT (e.g., contact opening CT) at which a portion of the upper surface of the auxiliary electrode 160a is exposed. The contact portion CT (e.g., contact hole portion CT) may be provided or formed simultaneously when a contact hole CNT is provided formed to electrically connect the pixel electrode 210 to the drain electrode 160d of the thin-film transistor TFT. The contact portion CT may include a first contact hole 170h2 defined in the organic insulating layer 170, and a second contact hole 165h defined in the inorganic insulating layer 165. The first contact hole 170h2 and the second contact hole 165h may correspond to or be aligned with each other to form the contact portion CT as a continuous hole. A contact area CTA at which the contact electrode 210a to be described later is electrically connected to the auxiliary electrode 160a via the contact portion CT, may be provided or formed.

The multi-insulating layer MIL may also have an open portion OP (e.g., opening OP) at which a portion of the organic insulating layer 170 is omitted. The open portion OP may be defined with an open hole 170h1 in the organic insulating layer 170 at which a portion of the inorganic insulating layer 165 is exposed. An open area OPA at which a portion of the inorganic insulating layer 165 is exposed via the open portion OP may be defined at the open portion OP.

In FIG. 3, the organic insulating layer 170 defines or includes both the open hole 170h1 defining the open portion OP, and the first contact hole 170h2 defining the contact portion CT. The open hole 170h1 and the first contact hole 170h2 are spaced apart from each other in a direction along the substrate 100 (e.g., along the x-axis direction). However, embodiments are not limited thereto.

Figure 6:
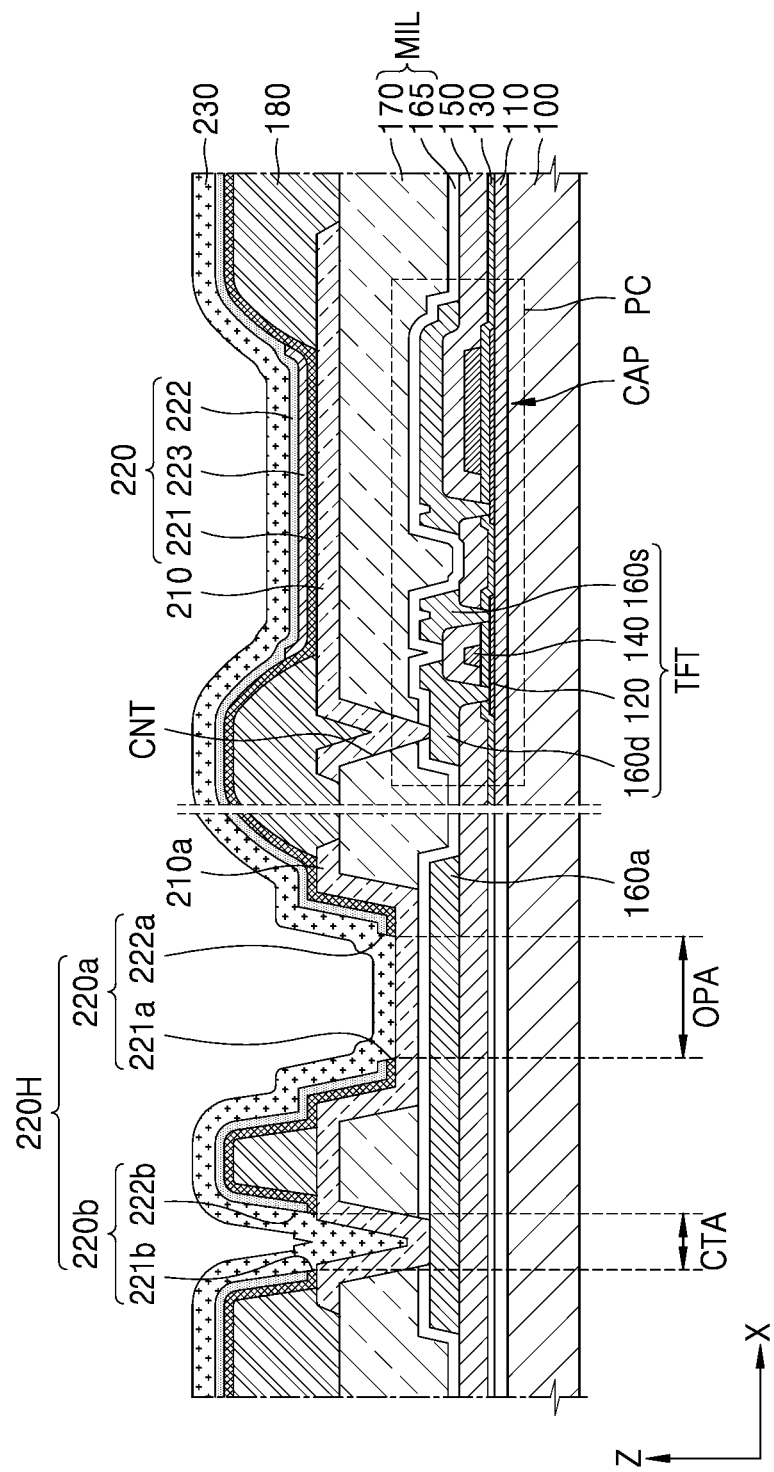
Figure 7:
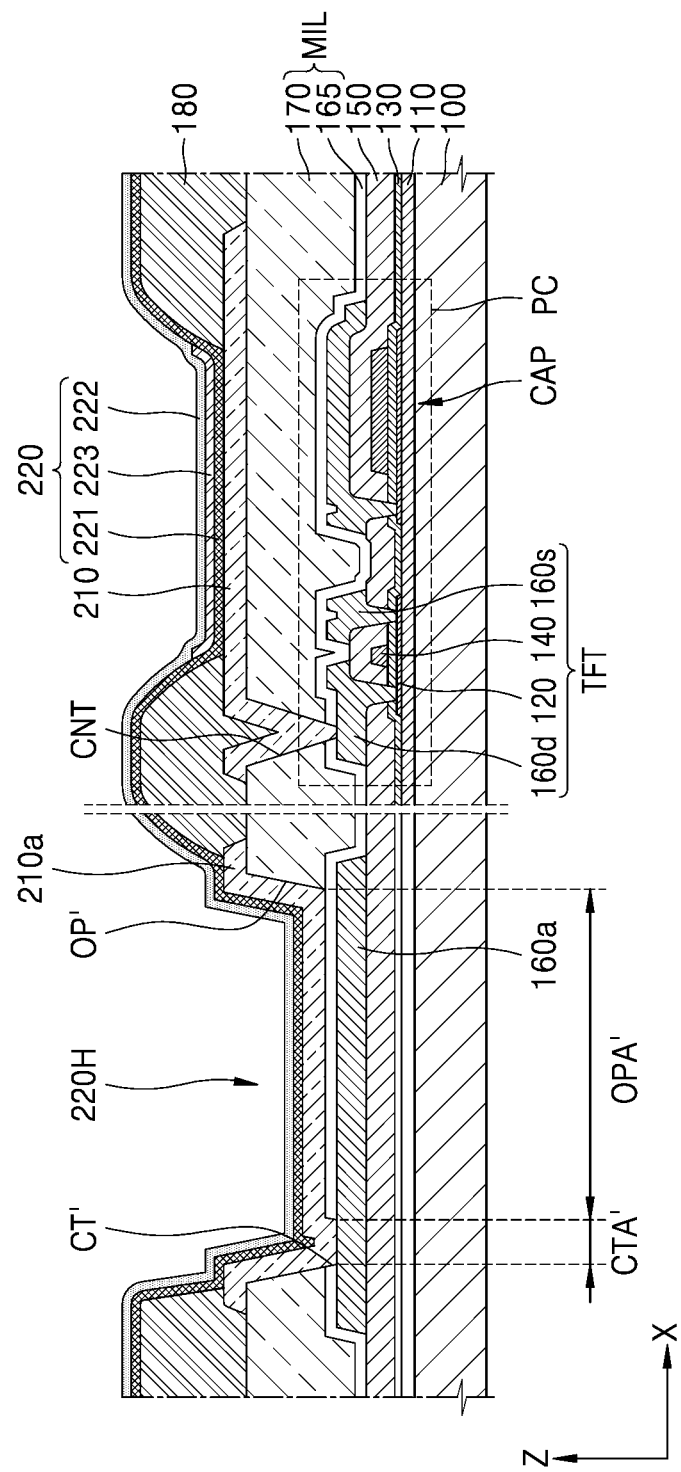
FIGS. 7 and 8 are cross-sectional views illustrating processes and structure in another embodiment of a method of manufacturing a display apparatus.

According to a modified embodiment, the open hole 170h1 and the first contact hole 170h2 of FIG. 3 may be connected to each other and thus may form a single one opening as shown in FIG. 7. Referring to FIG. 7, a contact portion CT' at which a portion of the auxiliary electrode 160a is exposed may be provided or formed in the inorganic insulating layer 165, and an open portion OP' corresponding to the contact portion CT' and having a larger dimension along the substrate 100 than the contact portion CT' may be provided or formed in the organic insulating layer 170. While FIGS. 3-6 and FIG. 7 show the x-axis direction (FIG. 1), the structure in FIG. 3 and FIG. 7 may also be applied along the y-axis direction.

A portion of the auxiliary electrode 160a may be exposed via the contact portion CT' located within the open portion OP' in the top plan view. A portion of the auxiliary electrode 160a which is exposed may define a contact area CTA' at which the contact electrode 210a and the auxiliary electrode 160a are connected to each other. A portion of the open portion OP' except for the contact area CTA' may be understood as an open area OPA'. That is, the contact area CTA' and the open area OPA' may define an entirety of the open portion OP' There is no electrical contact between elements in the open area OPA', but the open area OPA' may reduce outgassing which will be described later. The inorganic insulating layer 165 is between the contact electrode 210a and the auxiliary electrode 160a, except for the contact portion CT'.

The contact electrode 210a may be arranged on the auxiliary electrode 160a with the multi-insulating layer MIL therebetween. The contact electrode 210a may be electrically connected to the auxiliary electrode 160a at the contact portion CT. The contact electrode 210a may be provided or formed at the open portion OP. The contact electrode 210a may be located in the open portion OP and may be insulated from the auxiliary electrode 160a with the inorganic insulating layer 165 therebetween. In an embodiment, the contact electrode 210a may be disposed in the peripheral area PA (FIG. 1) without being limited thereto. According to an embodiment, the contact electrode 210a may be provided or formed using the same process as that used to form the pixel electrode 210, and may include the same material as that included in the pixel electrode 210. Referring to the similar hatching pattern in FIG. 3, the contact electrode 210a and the pixel electrode 210 may be respective portions of a same material layer on the substrate 100, and may be portions respectively formed from a same material layer in a method of manufacturing the display apparatus 10.

As such, the open area OPA, namely, the open portion OP, at which a portion of the organic insulating layer 170 is omitted, may be further included in addition to the contact portion CT at which the auxiliary electrode 160a and the contact electrode 210a are electrically connected to each other, and thus occurrence of outgassing in the organic insulating layer 170 including an organic insulating material during the manufacture of the display apparatus may be reduced.

Figure 4:
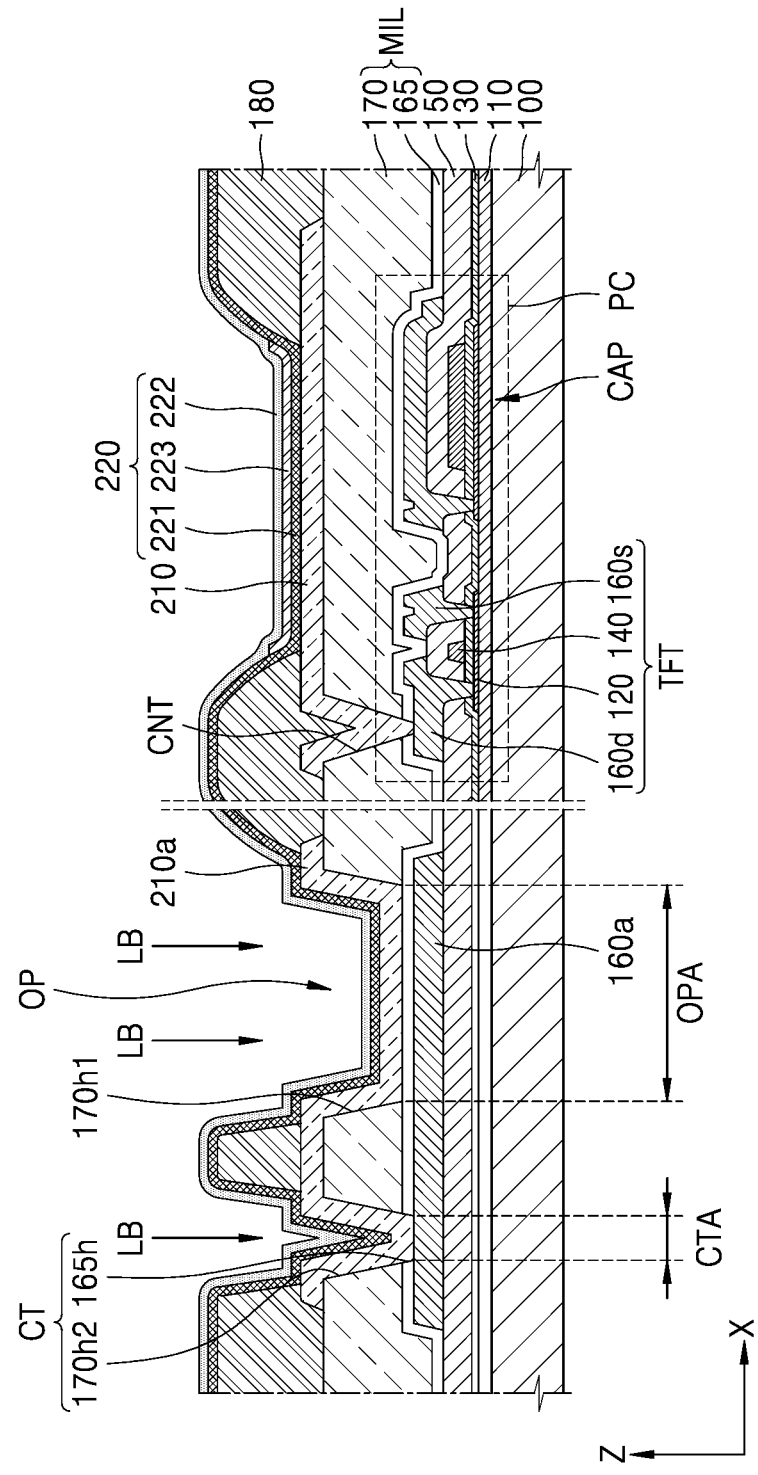

Referring to FIG. 4, a laser beam LB may be radiated to portions of the preliminary first functional material layer 221 and the preliminary second functional material layer 222 corresponding to the contact portion CT and the open portion OP. Due to the radiation of the laser beam LB, respective portions of the preliminary first functional material layer 221 and the preliminary second functional material layer 222 for forming the first and second functional layers 221 and 222 may be removed from the contact portion CT and the open portion OP.

Figure 5:
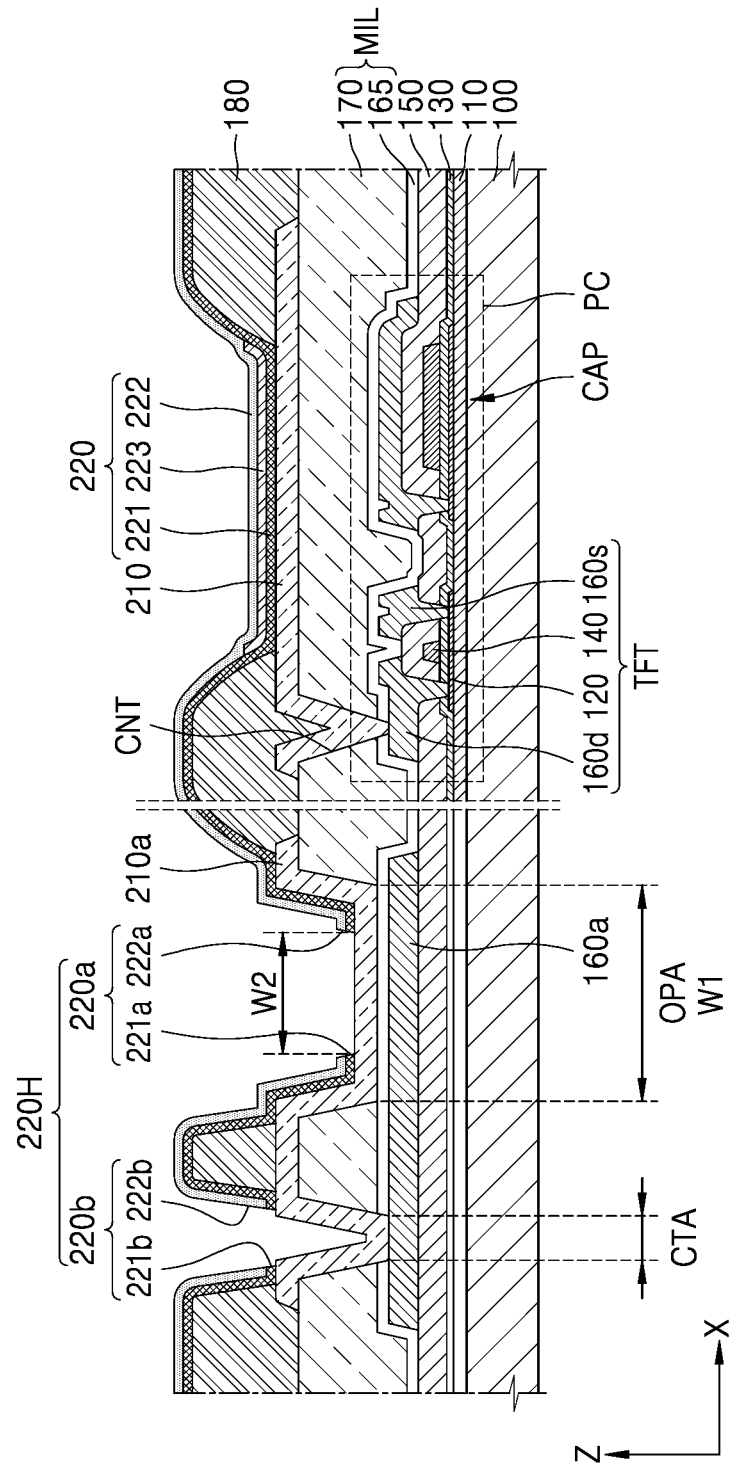

As shown in FIG. 5, an opening portion 220H may be provided or formed defined in the preliminary first functional material layer 221 and the preliminary second functional material layer 222 from which the first and second functional layers 221 and 222 are formed, by the laser beam LB. The opening portion 220H may include a first opening 220a and a second opening 220b spaced apart from each other along the substrate 100. In detail, in each of the preliminary first functional material layer 221 and the preliminary second functional material layer 222 from which the first and second functional layers 221 and 222 are formed, the first opening 220a corresponding to the open portion OP and the second opening 220b corresponding to the contact portion CT may be provided or formed. Since the first opening 220a and the second opening 220b are provided or formed by removing respective portions of the preliminary first functional material layer 221 and the preliminary second functional material layer 222 from which the first and second functional layers 221 and 222 are formed, such as by using the laser beam LB, portions (e.g., side surfaces) of the first and second functional layers 221 and 222 which define to the first opening 220a and the second opening 220b may be portions denaturalized by relatively high heat (e.g., heat denatured portions).

The first opening 220a may include a first hole 221a defined in the preliminary first functional material layer 221, and a second hole 222a defined in the preliminary second functional material layer 222. The second opening 220b may include a third hole 221b defined in the preliminary first functional material layer 221, and a fourth hole 222b defined in the preliminary second functional material layer 222. The first hole 221a and the second hole 222a may correspond to or be aligned with each other, and the third hole 221b and the fourth hole 222b may correspond to or be aligned with each other.

Referring to the similar hatching pattern in FIG. 5, portions of the first functional layer 221 at opposing sides of the first hole 221a and the third hole 221b and at the pixel P (e.g., corresponding to and extended from the light emitting region at the emission layer 223) may be respective portions of a same material layer on the substrate 100, and may be portions respectively formed from a same preliminary material layer in a method of manufacturing the display apparatus 10. Similarly, portions of the second functional layer 222 at opposing sides of the second hole 222a and the fourth hole 222b and at the pixel P (e.g., corresponding to and extended from the light emitting region at the emission layer 223) may be respective portions of a same material layer on the substrate 100, and may be portions respectively formed from a same preliminary material layer in a method of manufacturing the display apparatus 10.

According to the present embodiment, the intermediate layer 220 includes both the first functional layer 221 and the second functional layer 222. However, according to another embodiment, the second functional layer 222 may be omitted. In this case, the first opening 220a may include only the first hole 221a defined in the first functional layer 221, and the second opening 220b may include only the third hole 221b defined in the first functional layer 221.

Although the first opening 220a and the second opening 220b of the opening portion 220H are spaced apart from each other in FIG. 5, embodiments of the present disclosure are not limited thereto. According to a modified embodiment, the first opening 220a and the second opening 220b of FIG. 5 may be connected to each other and thus may form a single one of the opening portion 220H as shown in FIG. 7 which is continuous along the substrate 100.

Figure 8:
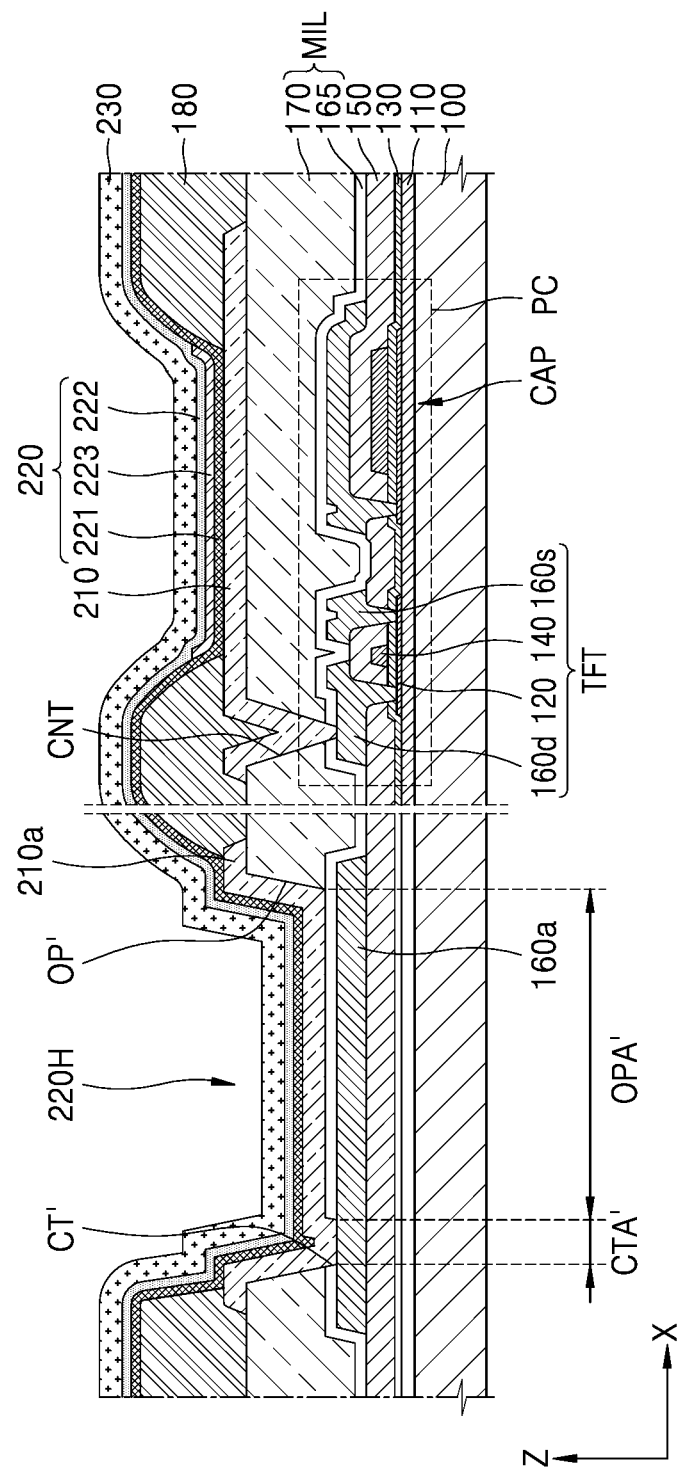

The opposite electrode 230 may be provided or formed on the stacked structure of FIG. 7, and thus, a structure as shown in FIG. 8 may be provided or formed. The above-described structures of FIGS. 7 and 8 may be understood as illustrations of a single structure provided or formed by one or more manufacturing operations.

Referring back to FIG. 5, a width W2 of the first opening 220a along the substrate 100 (e.g., in the x-axis direction) may be less than a width W1 of the open portion OP in the open area OPA along the substrate 100 (e.g., in the x-axis direction), but embodiments of the present disclosure are not limited thereto.

Referring to FIG. 6, the opposite electrode 230 may be provided formed on the stacked structure of FIG. 5, such as in an entirety of the display area DA. The opposite electrode 230 may be arranged opposite to the pixel electrode 210 with the intermediate layer 220 therebetween. The opposite electrode 230 may extend from the intermediate layer 220 to the first opening 220a and the second opening 220b. The opposite electrode 230 may directly contact the contact electrode 210a at the first opening 220a and the second opening 220b.

In the display apparatus and the method of manufacturing the same according to the present embodiment, the auxiliary electrode 160a and the contact electrode 210a which electrically connects the opposite electrode 230 to the auxiliary electrode 160a are provided or formed so that an electrical signal is delivered to the opposite electrode 230 via the auxiliary electrode 160a and the contact electrode 210a, which have relatively high electrical conductivity. Thus an internal electrical resistance ("IR") drop in the opposite electrode 230 that may occur in a conventional structure in which the auxiliary electrode 160a and the contact electrode 210a are not provided, may be effectively prevented or minimized. Accordingly, generation of an unintended brightness deviation in a plurality of pixels P may be reduced or effectively prevented, or a brightness deviation may be minimized.

For contact between the opposite electrode 230 and the auxiliary electrode 160a, as shown in FIG. 6, at least a portion of the contact electrode 210a should not be covered by the first functional layer 221 and the second functional layer 222. To this end, when a preliminary first functional material layer and a preliminary second functional material layer from which the first functional layer 221 and the second functional layer 222 are provided, are initially provided or formed on the substrate 100 in a conventional display apparatus, the preliminary first functional material layer and a preliminary second functional material layer may be selectively omitted at a portion of the contact electrode 210a. However, in the method of forming the conventional display apparatus, a mask is used to pattern the preliminary first functional material layer and a preliminary second functional material layer and provide the first functional layer 221 and the second functional layer 222. Thus, a manufacturing process of the conventional display apparatus may be complicated, such as including a process in which the mask and the substrate 100 are precisely aligned with each other.

However, in one or more embodiment of the method of manufacturing an organic light-emitting display apparatus, a preliminary first functional material layer and a preliminary second functional material layer are initially provided or formed on the substrate 100, for example, along an entirety of the substrate 100, and only respective portions of the preliminary first functional material layer and a preliminary second functional material layer which correspond to the contact electrode 210a are selectively removed such as by using a laser beam, and thus manufacturing efficiency may be greatly increased.

While the present disclosure has been particularly shown and described with reference to exemplary embodiments thereof, it will be understood by those of ordinary skill in the art that various changes in form and details may be made therein without departing from the spirit and scope as defined by the following claims. As described above, according to an embodiment of the present disclosure, a display apparatus being easily manufactured and having relatively high stability in brightness, and a method of manufacturing the same may be provided. Of course, the scope of the present disclosure is not restricted by this effect.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   providing on a substrate:
      a thin-film transistor electrically connected to a pixel electrode of a light emitting element,
      a contact electrode spaced apart from the pixel electrode in a direction along the substrate,
      an auxiliary electrode which is electrically connected to the contact electrode and spaced apart from the thin-film transistor in the direction along the substrate,
      an inorganic insulating layer on the thin-film transistor and the auxiliary electrode,
      an organic insulating layer between the inorganic insulating layer and the pixel electrode and between the inorganic insulating layer and the contact electrode, along a thickness direction of the substrate, and
      an open portion in the organic insulating layer which is provided in plural comprising:
         a first open portion which exposes the inorganic insulating layer to outside the organic insulating layer, and
         a second open portion which corresponds to a contact opening in the inorganic insulating layer, the second open portion together with the contact opening exposing the auxiliary electrode to outside the organic insulating layer and the inorganic insulating layer;
   providing an intermediate layer of the light emitting element, on the contact electrode and on the pixel electrode;
   removing a portion of the intermediate layer which corresponds to the contact electrode, to provide an opening in the intermediate layer which exposes the contact electrode to outside the intermediate layer; and
   after the exposing of the contact electrode to outside of the intermediate layer, providing an opposite electrode of the light emitting element which is on the intermediate layer, in contact with the contact electrode which is exposed at the opening in the intermediate layer and through which an electrical signal is transmitted from the auxiliary electrode to the opposite electrode,
   wherein the first open portion and the second open portion in the organic insulating layer are spaced apart from each other in the direction along the substrate, a portion of the organic insulating layer disposed between the first open portion and the second open portion, and
   wherein the inorganic insulating layer which is exposed by the first open portion covers an upper surface of the auxiliary electrode.

2. The method of claim 1, wherein
   the providing of the intermediate layer comprises sequentially providing:
      a first functional layer corresponding to the pixel electrode and the contact electrode, and
      an emission layer corresponding to the pixel electrode, and
   the providing the opening in the intermediate layer comprises removing a portion of the first functional layer which corresponds to the contact electrode.

3. The method of claim 2, wherein
   the providing the intermediate layer further comprises providing a second functional layer after the providing of the emission layer, the second functional layer corresponding to the pixel electrode and the contact electrode, and
   the providing of the opening in the intermediate layer further comprises removing a portion of the second functional layer which corresponds to the contact electrode, simultaneously with the removing of the portion of the first functional layer which corresponds to the contact electrode.

4. The method of claim 1, wherein the first open portion is larger than the contact opening.

5. The method of claim 1, wherein the first open portion and the contact opening are spaced apart from each other in the direction along the substrate.

6. The method of claim 1, wherein at an area corresponding to the open portion in the organic insulating layer, the inorganic insulating layer is between the contact electrode and the auxiliary electrode.

7. The method of claim 1, wherein the removing of the portion of the intermediate layer comprises:
   removing a first portion of the intermediate layer to expose the contact electrode to outside the intermediate layer, at the first open portion, and
   removing a second portion of the intermediate layer to expose the contact electrode to outside the intermediate layer, at the second open portion.

8. The method of claim 2, wherein the removing the portion of the first functional layer which corresponds to the contact electrode comprises radiating a laser beam to the portion of the first functional layer.

9. The method of claim 2, wherein
the contact electrode extends from the first open portion to the second open portion of the organic insulating layer, and
the removing the portion of the intermediate layer which corresponds to the contact electrode provides plural openings in the intermediate layer, the plural openings comprising:
  a first opening which exposes the contact electrode to outside the intermediate layer, at the first open portion of the organic insulating layer, and
  a second opening which exposes the contact electrode to outside the intermediate layer, at the second open portion of the organic insulating layer.

10. The method of claim 9, wherein the first open portion and the second open portion in the organic insulating layer are spaced apart from each other in the direction along the substrate.

11. The method of claim 10, wherein a thickness portion of the inorganic insulating layer and a thickness portion of the organic insulating layer are between the first open portion and the second open portion which are spaced apart from each other in the direction along the substrate.

12. The method of claim 9, wherein the contacting of the opposite electrode of the light emitting element to the contact electrode defines contact areas between the opposite electrode and the contact electrode, the contact areas including:
  a first contact area corresponding to the first open portion in the organic insulating layer, and
  a second contact area corresponding to contact opening in the organic insulating layer.

13. The method of claim 12, wherein
the first contact area and the second contact area are spaced apart from each other in the direction along the substrate, and
a portion of the inorganic insulating layer is between the first contact area and the second contact area which are spaced apart from each other in the direction along the substrate.

14. A method of manufacturing a display apparatus, the method comprising:
providing on a substrate:
  a thin-film transistor electrically connected to a pixel electrode of a light emitting element,
  a contact electrode spaced apart from the pixel electrode in a direction along the substrate,
  an auxiliary electrode which is electrically connected to the contact electrode and spaced apart from the thin-film transistor in the direction along the substrate,
  an inorganic insulating layer on the thin-film transistor and the auxiliary electrode,
  an organic insulating layer between the inorganic insulating layer and the pixel electrode and between the inorganic insulating layer and the contact electrode, along a thickness direction of the substrate, and
  an open portion in the organic insulating layer which is provided in plural comprising:
    a first open portion which exposes the inorganic insulating layer to outside the organic insulating layer, and
    a second open portion which corresponds to a contact opening in the inorganic insulating layer, the second open portion together with the contact opening exposing the auxiliary electrode to outside the organic insulating layer and the inorganic insulating layer;
providing an intermediate layer of the light emitting element, on the contact electrode and on the pixel electrode;
removing a portion of the intermediate layer which corresponds to the contact electrode, to provide an opening in the intermediate layer which exposes the contact electrode to outside the intermediate layer; and
after the exposing of the contact electrode to outside of the intermediate layer, providing an opposite electrode of the light emitting element which is on the intermediate layer, in contact with the contact electrode which is exposed at the opening in the intermediate layer and through which an electrical signal is transmitted from the auxiliary electrode to the opposite electrode,
wherein the first open portion and the second open portion in the organic insulating layer are spaced apart from each other in the direction along the substrate, and
wherein a thickness portion of the inorganic insulating layer and a thickness portion of the organic insulating layer are between the first open portion and the second open portion which are spaced apart from each other in the direction along the substrate.

* * * * *